United States Patent
Kumar et al.

(10) Patent No.: US 12,118,836 B2
(45) Date of Patent: Oct. 15, 2024

(54) PROBABILITY NEURAL NETWORK FOR REDUCED BATTERY POWER DRAIN

(71) Applicant: FORD GLOBAL TECHNOLOGIES, LLC, Dearborn, MI (US)

(72) Inventors: Vivek Kumar, Troy, MI (US); Di Zhu, Canton, MI (US); Sumanth Reddy Dadam, New Hudson, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 485 days.

(21) Appl. No.: 17/490,170

(22) Filed: Sep. 30, 2021

(65) Prior Publication Data
US 2023/0098099 A1 Mar. 30, 2023

(51) Int. Cl.
*G07C 5/08* (2006.01)
*G01R 31/382* (2019.01)
*G05B 13/02* (2006.01)

(52) U.S. Cl.
CPC ......... *G07C 5/0816* (2013.01); *G01R 31/382* (2019.01); *G05B 13/027* (2013.01)

(58) Field of Classification Search
CPC ...... G07C 5/0816; G07C 5/08; G01R 31/382; G01R 31/007; G05B 13/027; B60R 16/03; Y02T 10/70; G05D 1/00; B60W 50/00; G08G 1/00; G01C 21/00
See application file for complete search history.

(56) References Cited

U.S. PATENT DOCUMENTS

| | | | |
|---|---|---|---|
| 7,830,270 B1* | 11/2010 | Philbert | B60N 2/002 340/584 |
| 8,212,527 B2 | 7/2012 | Zhang et al. | |
| 9,066,298 B2 | 6/2015 | Pandya et al. | |
| 9,462,545 B2 | 10/2016 | Kleve et al. | |
| 10,173,320 B1* | 1/2019 | Prisament | B25J 9/1664 |
| 10,401,937 B2 | 9/2019 | Darin et al. | |
| 10,430,178 B2* | 10/2019 | Mitchell | H04W 4/44 |
| 10,884,475 B1* | 1/2021 | Wang | G06F 1/3296 |
| 11,466,998 B1* | 10/2022 | Williams | G06Q 10/0635 |
| 11,900,092 B2* | 2/2024 | Sakurai | H04W 4/14 |
| 2014/0343831 A1 | 11/2014 | Hosey et al. | |
| 2016/0147525 A1* | 5/2016 | Choi | G06F 8/65 717/173 |
| 2018/0102939 A1* | 4/2018 | Kim | H04L 12/40169 |
| 2018/0189045 A1* | 7/2018 | Dalke | B60W 30/06 |
| 2018/0231971 A1* | 8/2018 | Greenberger | G08G 5/0069 |
| 2018/0238289 A1* | 8/2018 | Khonizi | H04L 67/303 |
| 2019/0193653 A1* | 6/2019 | Nakamura | G06F 9/4893 |
| 2019/0212997 A1* | 7/2019 | Sangameswaran | H04L 67/52 |
| 2019/0219026 A1* | 7/2019 | Sheldon-Coulson | B63B 35/44 |
| 2019/0258466 A1* | 8/2019 | Mitchell | H04L 67/34 |
| 2020/0065087 A1* | 2/2020 | Miura | H04L 67/34 |
| 2020/0286305 A1* | 9/2020 | Diamond | B60W 50/14 |
| 2021/0109524 A1* | 4/2021 | Goldman | G06Q 10/06311 |

(Continued)

Primary Examiner — Angelina M Shudy
(74) Attorney, Agent, or Firm — David B. Kelley; Brooks Kushman P.C.

(57) ABSTRACT

A processor, responsive to detecting a controller is drawing power from a battery to perform a task when a vehicle is parked and detecting a parameter indicative of a likelihood that the controller will complete the task within a predefined time period has a value less than a threshold value, generates a message for a user requesting whether the controller should be shut down without completing the task.

16 Claims, 3 Drawing Sheets

(56) References Cited

U.S. PATENT DOCUMENTS

| | | | | |
|---|---|---|---|---|
| 2021/0141669 | A1* | 5/2021 | Seino | B60R 16/03 |
| 2021/0173635 | A1* | 6/2021 | Shin | G01R 31/3647 |
| 2021/0312564 | A1* | 10/2021 | Katata | G06F 21/606 |
| 2021/0327161 | A1* | 10/2021 | Diamond | B60L 53/60 |
| 2021/0403010 | A1* | 12/2021 | Symanow | B60W 50/0225 |
| 2022/0253304 | A1* | 8/2022 | Tamachi | G06F 8/65 |
| 2022/0289216 | A1* | 9/2022 | Kamiyamaguchi | G07C 5/085 |
| 2023/0034680 | A1* | 2/2023 | Ando | G06F 8/65 |
| 2023/0176850 | A1* | 6/2023 | Oh | H04L 67/34 717/171 |
| 2024/0078104 | A1* | 3/2024 | Yang | G06F 8/65 |

\* cited by examiner

PROBABILITY NEURAL NETWORK FOR REDUCED BATTERY POWER DRAIN

TECHNICAL FIELD

The present disclosure relates to strategies for reducing vehicle battery drain during park.

BACKGROUND

Maintaining a sufficient level of state of charge (SOC) in low-voltage batteries (e.g. 12V batteries) can be useful for starting vehicles having a conventionally fuel engine. There are occasions, however, when the vehicles wake up and discharge the low-voltage batteries. These may be triggered by a variety of activities such as on-board diagnostic (OBD) tests, controller software updates, or the like.

SUMMARY

A vehicle includes a battery, a plurality of controllers, and a processor. The processor, responsive to detecting at least one of the controllers is drawing power from the battery to perform a task when the vehicle is parked and detecting a parameter has a value less than a threshold value, commands the at least one controller to shut down without completing the task. The threshold value depends on the task being performed such that different tasks have different threshold values.

A vehicle system includes a processor that, responsive to detecting a controller is drawing power from a battery to perform a task when the vehicle is parked and detecting a parameter indicative of a likelihood that the controller will complete the task within a predefined time period has a value less than a threshold value, generates a message for a user requesting whether the controller should be shut down without completing the task. The controller further, responsive to detecting the controller is drawing power from the battery to perform the task when the vehicle is parked and detecting the parameter has a value greater than the threshold value, precludes shutting down the controller without completing the task.

A method includes, responsive to detecting a controller of a vehicle is drawing power from a battery to perform a task when the vehicle is parked and detecting a parameter has a value less than a threshold value that depends on the task being performed, commanding the controller to shut down without completing the task.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The present disclosure generally provides for a plurality of circuits or other electrical devices. All references to the circuits and other electrical devices, and the functionality provided by each, are not intended to be limited to encompassing only what is illustrated and described herein. While particular labels may be assigned to the various circuits or other electrical devices, such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electric devices may be configured to execute a computer-program that is embodied in a non-transitory computer readable medium that is programed to perform any number of the functions as disclosed.

The present disclosure, among other things, proposes a system for reducing vehicle battery drain while the vehicle is parked. More specifically, the present disclosure proposes a system for reducing vehicle battery drain by predicting a successful rate for a vehicle module triggering a vehicle wakeup using a probabilistic neural network (PNN).

Figure 1:
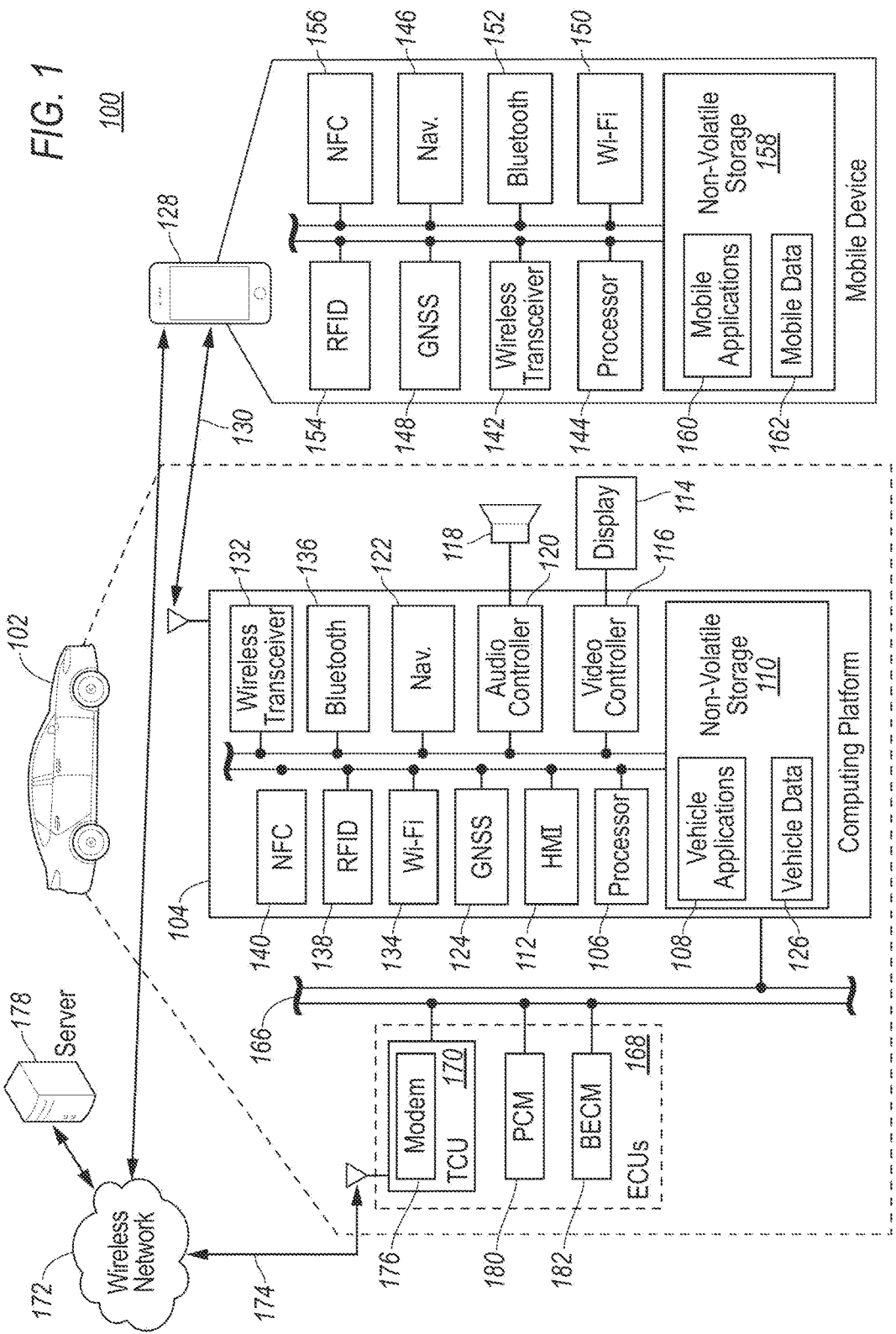
FIG. 1 illustrates an example block topology of a vehicle system.

Referring to FIG. 1, an example block topology of a vehicle system 100 of one embodiment of the present disclosure is illustrated. A vehicle 102 may include various types of automobile, crossover utility vehicle (CUV), sport utility vehicle (SUV), truck, recreational vehicle (RV), boat, plane, or other mobile machine for transporting people or goods. In many cases, the vehicle 102 may be powered by an internal combustion engine. As another possibility, the vehicle 102 may be a battery electric vehicle (BEV), a hybrid electric vehicle (HEV) powered by both an internal combustion engine and one or move electric motors, such as a series hybrid electric vehicle (SHEV), a plug-in hybrid electric vehicle (PHEV), or a parallel/series hybrid vehicle (PSHEV). It should be noted that the illustrated system 100 is merely an example, and more, fewer, and/or differently located elements may be used.

As illustrated in FIG. 1, a computing platform 104 may include one or more processors 106 configured to perform instructions, commands, and other routines in support of the processes described herein. For instance, the computing platform 104 may be configured to execute instructions of vehicle applications 108 to provide features such as navigation, remote controls, and wireless communications. Such instructions and other data may be maintained in a non-volatile manner using a variety of types of computer-readable storage medium 110. The computer-readable medium 110 (also referred to as a processor-readable medium or storage) includes any non-transitory medium (e.g., tangible medium) that participates in providing instructions or other data that may be read by the processor 106 of the computing platform 104. Computer-executable instructions may be compiled or interpreted from computer programs created using a variety of programming languages and/or technologies, including, without limitation, and either alone or in combination, Java, C, C++, C#, Objective C, Fortran, Pascal, Java Script, Python, Perl, and SQL.

The computing platform 104 may be provided with various features allowing the vehicle occupants/users to interface with the computing platform 104. For example, the computing platform 104 may receive input from HMI controls 112 configured to provide for occupant interaction with the vehicle 102. As an example, the computing platform 104 may interface with one or more buttons, switches, knobs, or other HMI controls configured to invoke functions on the computing platform 104 (e.g., steering wheel audio buttons, a push-to-talk button, instrument panel controls, etc.).

The computing platform 104 may also drive or otherwise communicate with one or more displays 114 configured to provide visual output to vehicle occupants by way of a video controller 116. In some cases, the display 114 may be a touch screen further configured to receive user touch input via the video controller 116, while in other cases the display 114 may be a display only, without touch input capabilities. The computing platform 104 may also drive or otherwise communicate with one or more speakers 118 configured to provide audio output and input to vehicle occupants by way of an audio controller 120.

The computing platform 104 may also be provided with navigation and route planning features through a navigation controller 122 configured to calculate navigation routes responsive to user input via e.g., the HMI controls 112, and output planned routes and instructions via the speaker 118 and the display 114. Location data that is needed for navigation may be collected from a global navigation satellite system (GNSS) controller 124 configured to communicate with multiple satellites and calculate the location of the vehicle 102. The GNSS controller 124 may be configured to support various current and/or future global or regional location systems such as the global positioning system (GPS), Galileo, Beidou, Global Navigation Satellite System (GLONASS) and the like. Map data used for route planning may be stored in the storage 110 as a part of the vehicle data 126. Navigation software may be stored in the storage 110 as one of the vehicle applications 108.

The computing platform 104 may be configured to wirelessly communicate with a mobile device 128 of the vehicle users/occupants via a wireless connection 130. The mobile device 128 may be any of various types of portable computing devices, such as cellular phones, tablet computers, wearable devices, smart watches, smart fobs, laptop computers, portable music players, or other device capable of communication with the computing platform 104. A wireless transceiver 132 may be in communication with a Wi-Fi controller 134, a Bluetooth controller 136, a radio-frequency identification (RFID) controller 138, a near-field communication (NFC) controller 140, and other controllers such as a Zigbee transceiver, an IrDA transceiver, an ultra-wide band (UWB) controller (not shown), and be configured to communicate with a compatible wireless transceiver 142 of the mobile device 128.

The mobile device 128 may be provided with a processor 144 configured to perform instructions, commands, and other routines in support of the processes such as navigation, telephone, wireless communication, and multi-media processing. For instance, the mobile device 128 may be provided with location and navigation functions via a navigation controller 146 and a GNSS controller 148. The mobile device 128 may be provided with a wireless transceiver 142 in communication with a Wi-Fi controller 150, a Bluetooth controller 152, an RFID controller 154, an NFC controller 156, and other controllers (not shown), configured to communicate with the wireless transceiver 132 of the computing platform 104. The mobile device 128 may be further provided with a non-volatile storage 158 to store various mobile applications 160 and mobile data 162.

The computing platform 104 may be further configured to communicate with various components of the vehicle 102 via one (or more) in-vehicle network 166. The in-vehicle network 166 may include, but is not limited to, one or more of a controller area networks (CAN), an Ethernet network, and a media-oriented system transport (MOST), as some examples. Furthermore, the in-vehicle network 166, or portions of the in-vehicle network 166, may be a wireless network accomplished via Bluetooth low-energy (BLE), Wi-Fi, UWB, or the like.

The computing platform 104 may be configured to communicate with various ECUs 168 of the vehicle 102 configured to perform various operations. For instance, the computing platform 104 may be configured to communicate with a TCU 170 configured to control telecommunication between the vehicle 102 and a wireless network 172 through a wireless connection 174 using a modem 176. The wireless connection 174 may be in the form of various communication networks, e.g., a cellular network. Through the wireless network 172, the vehicle may access one or more servers 178 to access various content for various purposes. It is noted that the terms wireless network and server are used as general terms in the present disclosure and may include any computing network involving carriers, router, computers, controllers, circuitry or the like configured to store data and perform data processing functions and facilitate communication between various entities. The ECUs 168 may further include a powertrain control module (PCM) 180 configured to operate a powertrain of the vehicle 102. The ECUs 168 may further include battery electric control modules (BECM) 182 configured to monitor and control various operations of a traction battery 124 for a hybrid or electric vehicle.

Figure 2:
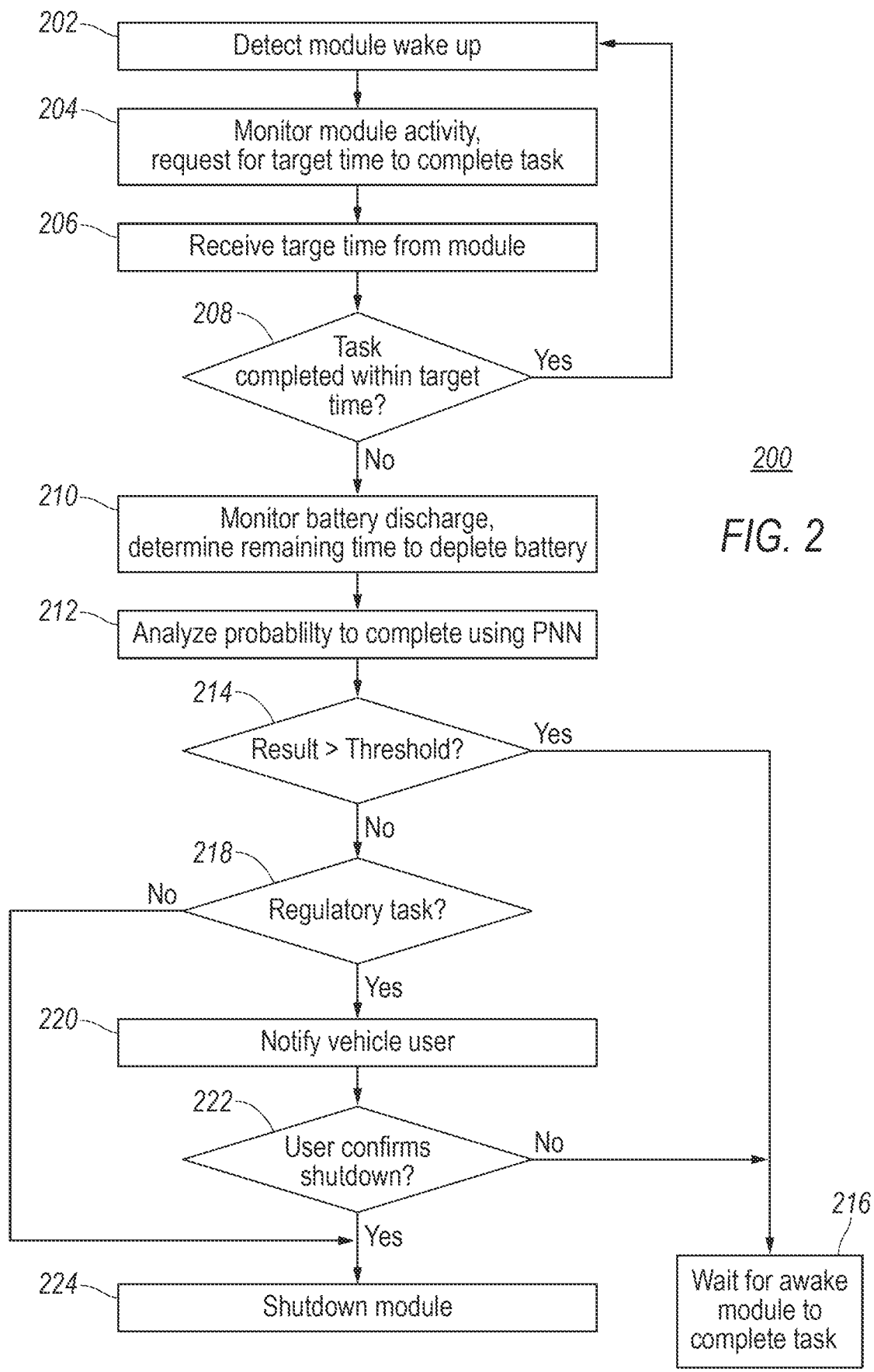
FIG. 2 illustrates an example flow diagram of a process for reducing battery drain.

Referring to FIG. 2, an example flow diagram of a process 200 for reducing drain of the battery is illustrated. With continuing reference to FIG. 1, the process 200 may be implemented via various components of the vehicle 102 individually or collectively. For instance, the process 200 may be implemented via the computing platform 104. Alternatively, the process 200 may be implemented via one or more ECUs or controllers shown or not shown in FIG. 1 in addition to or in lieu of the computing platform 104. For simplicity purposes, the following description will be introduced with reference to the computing platform 104 although the present disclosure is not limited thereto.

Responsive to detecting a vehicle module wakeup at operation 202, the computing platform 104 monitors activities of the awake module and sends a request to the awake module for a target time to complete the current task. The term module in the process 200 may be used as a general term and may refer to one or more ECUs 168, and/or controllers. For instance, the module may include the PCM 180, the BECM 182, as well as controllers of the computing platform 104 such as the navigation controller 122 or the like. At operation 206, the computing platform 104 receives the target time to complete the task from the awake module. In the present example, each awake module may determine the target time and send the target time to the computing platform 104. Alternatively, the computing platform 104 may be configured to determine the target time based on information of the module activity as monitored. At operation 208, if the awake module successfully completed the task within the target time, the computing platform 104 ignores the present awake module and the process returns to operation 202 such that the computing platform 104 continues to monitor other module wakeup activities. Otherwise, responsive to detecting the awake module is still performing the task upon the expiration of the target time, the process proceeds to operation 210 and the computing platform 104 monitors the battery discharge and determines a remaining time to deplete the battery below SOC a threshold insufficient to start the vehicle.

At operation 212, the computing platform 104 analyzes the probability for the awake module to complete the task within the remaining time before the battery is depleted using a probability neural network (PNN, to be discussed in detail later with reference to FIG. 3). The PNN is configured to output a result indicative of a probability for the awake module to complete the task within the remaining time. As an example, the probability result may be in a percentage form. At operation 214, the computing platform 104 compares the probability result against a predefined threshold. If the probability result is above the threshold, indicative of the awake module being more likely to complete the task within the remaining time, the process proceeds to operation 216 and the computing platform 104 waits for the awake module to complete the task. Otherwise, if the PNN result is less than the threshold, indicative of a lesser chance that the awake module will complete the task, the process proceeds to operation 218. The threshold may be a predetermined number calibrated for each module that may be tested by the process 200. In other words, each module may be assigned a different threshold. In one example, module activities involving certain tasks (e.g. OBD monitor tests) may be assigned lower thresholds (e.g. 25%) such that the awake module is more likely to be allowed to complete the task. Module activities involving other tasks (e.g. navigation map/software updates) may be assigned higher thresholds (e.g. 35%) such that the awake module is less likely to be allowed to complete the task to conserve battery charge. Additionally, the computing platform 104 may be further configured to adjust the threshold based on various factors such as current charge of the low voltage battery, remaining time, ambient temperature, or the like. For instance, responsive to detecting a lower ambient temperature via a temperature sensor (not shown) indicative of more electric charge being needed to start the vehicle engine, the computing platform 104 may increase the threshold to preserve battery charge. At operation 218, the computing platform 104 verifies if the current task being performed by the awake module is a certain type of task (e.g. an OBD monitor test). If not, the process proceeds to operation 224 and the computing platform 104 instructs the awake module to stop performing the task and shut down. Otherwise, if the current task is a certain type of task, the process proceeds to operation 220 and the computing platform 104 notifies the vehicle user about the current vehicle situation and the possible battery depletion. The notification further includes a request for user input to provide instructions on whether the vehicle 102 is to wait for the task to complete or to shut down the awake module. Responsive to receiving a user confirmation to shut down, the process proceeds to operation 224. Otherwise, the process proceeds to operation 216.

Figure 3:
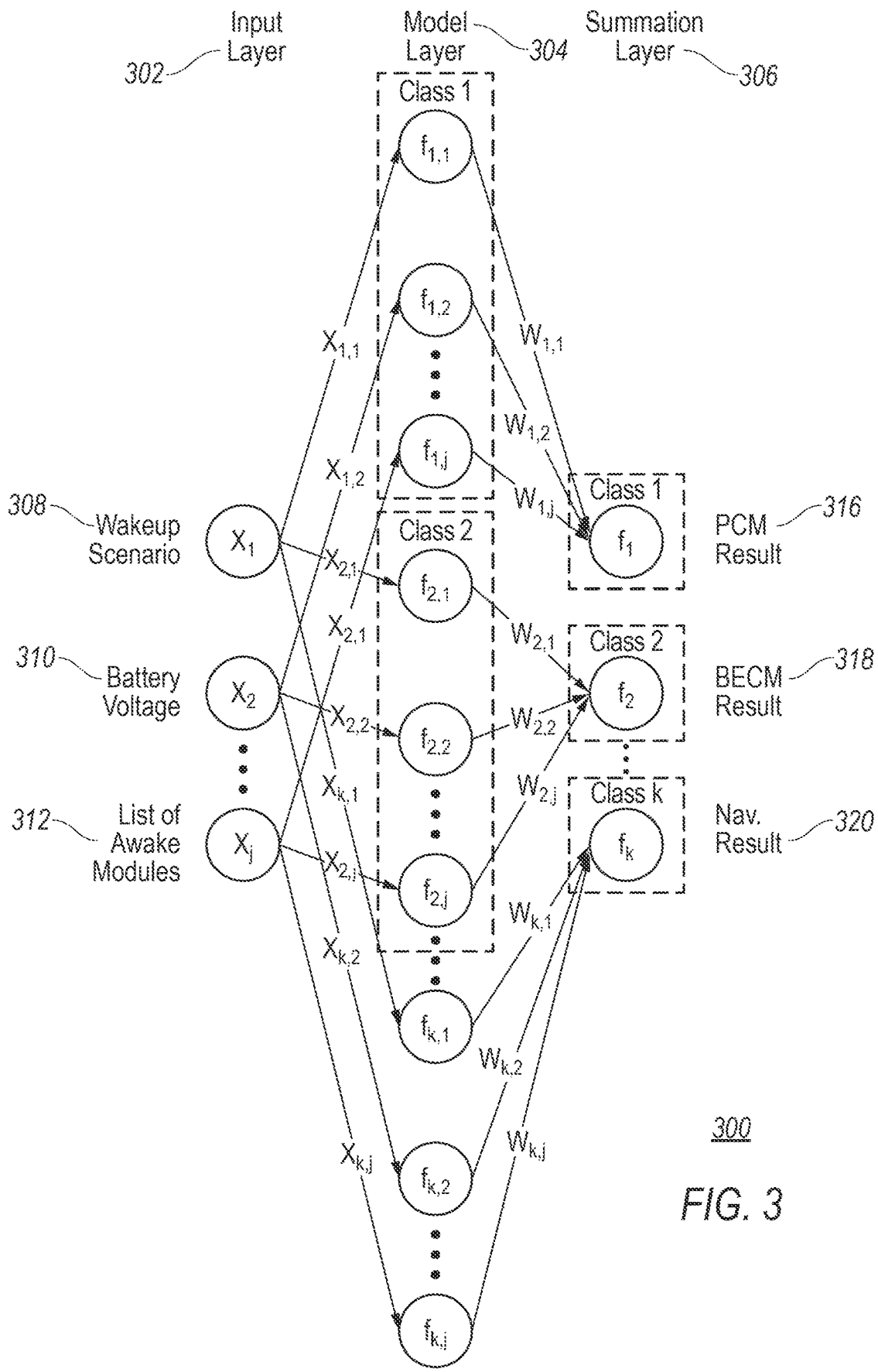
FIG. 3 illustrates an example diagram for a probabilistic neural network.

Referring to FIG. 3, an example PNN diagram 300 is illustrated. Within continuing reference to FIGS. 1 and 2, the PNN 300 may be configured to determine the probability result for each awake module to complete the task as described in operation 212. The PNN 300 in the present example includes three layers. An input layer 302 receives various factors as input and sends the inputs to a model layer 304 for processing. A summation layer 306 outputs a plurality of classes each corresponding to a probability result of a module/controller. In detail, the number of input neurons in the input layer 302 is equal to the number of inputs $X_1$-$X_j$. In the summation layer 306, each summation neuron represents a class $f_1$-$f_k$. In the model layer 304, each neuron represents a pattern which corresponds to an input from the input layer 302 and a class in the summation layer 306. For instance, a first neuron $f_{1,1}$ in the model layer 304 corresponds to an input $X_1$ from the input layer 302 and a first class $f_1$ in the summation layer 306. In other words, each pattern represents a signature/characteristic of a specific input X for a given class f. In the present example, each pattern of one class in the model layer corresponds to one specific input X. In other words, the number of patterns within a class is equal to the number of the pattern. Therefore, the number of model neurons is equal to the number of input neurons multiplied by the number of the summation neurons.

Various inputs may be considered to evaluate the chance for the awake module to complete the task. For instance, the inputs may include a first input $X_1$ corresponding to one or more wakeup scenarios 308, a second input $X_2$ corresponding to a voltage of the battery 310, and a jth input $j_k$ corresponding to a list of awake modules 312, as well as other factors such as a list of completed tests, test histories, or the like (not shown). It is noted that although only three input neurons 308-312 are illustrated in the input layer 302, the present disclosure is not limited to three and the input layer 302 (as well as the model layer 304 and the summation layer 306) may include more neurons based on different design needs. Each input may be quantified into a numerical value. For instance, the wakeup scenario may include a plurality of options such as OBD monitor test, high-voltage charging event, ECU software update, map update or the like, each assigned with a unique identification number/value. Patterns in the model layer 304 may be divided into a plurality of classes. The number of the classes f in the model layer 304 is equal to the output classes in the summation layer 306. Each class f in the model layer 304 may include a plurality of neurons corresponding to the input X in the input layer 304.

The patterns in the model layer 304 may be calculated using a probabilistic function for input j in class k, and may be expressed as:

$$f_{kj}(X) = e^{\left(\frac{(X_j-X_{kj})^2}{2\sigma^2}\right)} \quad (1)$$

wherein $(X-X_{kj})^2$ in equation (1) represents the square of the Euclidean distance between classification vector X and input characteristic vector $X_{kj}$ and a represents the smoothing parameter (e.g. 0.1). Each input characteristic vector $X_{kj}$ may be represented by a numeric value determined and adjusted at a training stage. Once the training for the PNN 300 is done, the $X_{kj}$ is set. The patterns $f_{kj}$ in the model layer 304 may be processed using a summation equation to determine the class:

$$f_k(X) = \left(\frac{1}{n_k}\right)\sum_{j=1}^{n_k} W_{kj} f_{kj}(X) \quad (2)$$

wherein $n_k$ represents the number of patterns in class k, and $W_{kj}$ represents the weight of the jth input in class k. Through the above processing, the probability result for each awake module to complete the task may be obtained. In other words, the summation layer 306 may output a plurality of classes each representing a probability result to complete a task for each awake module. As illustrated in FIG. 3, the summation layer 306 may output a PCM result 316 indicative of the probability result for the PCM 180 to complete the task if awake, a BECM result 318 indicative of the probability result for the BECM 182 to complete the task if awake, and a navigation result 316 indicative of the probability result for the navigation controller 122 to complete the task if awake. In normal operations, there may be only a few modules/controllers awake when the vehicle 102 is parked and it is unlikely that all modules/controllers that are represented in the summation layer 306 are awake at the same time. To address this situation, the PNN 300 may be configured to reach a high likelihood (above 90%) for the unawake module/controllers to complete the task such that the probability result for unawake modules/controllers is always above the threshold discussed with reference to FIG. 2. Therefore, the system may practically ignore the unawake modules/controllers.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure.

As previously described, the features of various embodiments can be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to, strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
a battery;
a plurality of controllers; and
a processor programmed to, responsive to detecting at least one of the controllers is drawing power from the battery to perform a task when the vehicle is parked and detecting a parameter has a value less than a threshold value, command the at least one controller to shut down without completing the task, wherein the threshold value depends on a state of charge of the battery and the task being performed such that different tasks have different threshold values.

2. The vehicle of claim 1, wherein the processor is further programmed to, responsive to detecting the at least one of the controllers is drawing power from the battery to perform a task when the vehicle is parked and detecting the parameter has a value greater than the threshold value, wait for the at least one controller to complete the task.

3. The vehicle of claim 1, wherein the threshold value further depends on ambient temperature.

4. The vehicle of claim 1, wherein the processor is further programmed to implement a probability neural network that generates the value.

5. The vehicle of claim 1, wherein the value indicates a likelihood that the at least one controller will complete the task within a predefined time period.

6. A vehicle system comprising:
a processor programmed to,
responsive to detecting a controller is drawing power from a battery to perform a task when the vehicle is parked and detecting a parameter indicative of a likelihood that the controller will complete the task within a predefined time period has a value less than a threshold value, generate a message for a user requesting whether the controller should be shut down without completing the task, and
responsive to detecting the controller is drawing power from the battery to perform the task when the vehicle is parked and detecting the parameter has a value greater than the threshold value, preclude shutting down the controller without completing the task.

7. The vehicle system of claim 6, wherein the processor is further programmed to, responsive to confirmation from the user that the controller should be shut down without completing the task, command the controller to shut down without completing the task.

8. The vehicle system of claim 6, wherein the threshold value depends on the task being performed such that different tasks have different threshold values.

9. The vehicle system of claim 6, wherein the threshold value depends on a state of charge of the battery.

10. The vehicle system of claim 6, wherein the threshold value depends on ambient temperature.

11. The vehicle system of claim 6, wherein the processor is further programmed to implement a probability neural network that generates the value.

12. A method comprising:
responsive to detecting a controller of a vehicle is drawing power from a battery to perform a task when the vehicle is parked and detecting a parameter has a value less than a threshold value that depends on the task being performed, commanding the controller to shut down without completing the task; and
altering the value based on ambient temperature.

13. The method of claim 12 further comprising, responsive to detecting the controller is drawing power from the battery to perform a task when the vehicle is parked and the parameter having a value greater than the threshold value, waiting for the controller to complete the task.

14. The method of claim 12 further comprising altering the value based on a state of charge of the battery.

15. The method of claim 12 further comprising generating the value via a probability neural network.

16. The method of claim 12, wherein the value indicates a likelihood that the at least one controller will complete the task within a predefined time period.

\* \* \* \* \*